US008642941B2

(12) United States Patent
Vermeulen et al.

(10) Patent No.: US 8,642,941 B2
(45) Date of Patent: Feb. 4, 2014

(54) PHOTONIC INTEGRATED CIRCUIT WITH INTEGRATED OPTICAL TRANSCEIVER

(75) Inventors: Diedrik Vermeulen, Sint-Pauwels (BE); Günther Roelkens, Melle (BE)

(73) Assignees: IMEC, Leuven (BE); Universiteit Gent, Gent (BE)

( * ) Notice: Subject to any disclaimer, the term of this patent is extended or adjusted under 35 U.S.C. 154(b) by 270 days.

(21) Appl. No.: 13/105,960

(22) Filed: May 12, 2011

(65) Prior Publication Data

US 2011/0278441 A1  Nov. 17, 2011

Related U.S. Application Data

(60) Provisional application No. 61/334,057, filed on May 12, 2010.

(30) Foreign Application Priority Data

Sep. 17, 2010 (EP) ...................................... 10177399

(51) Int. Cl.
H01J 40/14 (2006.01)
(52) U.S. Cl.
USPC ..................................................... 250/214 R
(58) Field of Classification Search
USPC .................. 250/226, 214 R; 398/138, 139
See application file for complete search history.

(56) References Cited

U.S. PATENT DOCUMENTS

| 5,262,656 A | 11/1993 | Blondeau et al. |
| 5,652,813 A * | 7/1997 | Wilson .............................. 385/24 |
| 6,897,498 B2 | 5/2005 | Gothoskar et al. |
| 7,418,208 B2 * | 8/2008 | Weigert ......................... 398/135 |
| 2004/0136658 A1 * | 7/2004 | Kropp .............................. 385/88 |
| 2005/0201665 A1 | 9/2005 | Manderscheid |
| 2008/0205899 A1 * | 8/2008 | Kopp et al. .................... 398/139 |

FOREIGN PATENT DOCUMENTS

| DE | 19807782 | 9/1999 |
| GB | 9108837.7 | 6/1991 |
| GB | 0122712.3 | 1/2003 |

OTHER PUBLICATIONS

European Search Report, European Patent Application No. EP10177399, dated Dec. 15, 2010.

* cited by examiner

*Primary Examiner* — Thanh Luu
(74) *Attorney, Agent, or Firm* — McDonnell Boehnen Hulbert & Berghoff LLP

(57) ABSTRACT

Photonic structures and methods of operating the photonic structures are disclosed. In one embodiment, the photonic structure includes a detector configured to detect radiation of a first wavelength range. The radiation of the first wavelength range is received from an external radiation guide, and the detector is substantially transparent to radiation of a second wavelength range that differs from the first wavelength range. The photonic structure further includes a coupling structure configured to free space couple out of the photonic structure radiation of the second wavelength range. The photonic structure further includes a guiding structure configured to optically guide the radiation of the second wavelength range through the detector.

9 Claims, 8 Drawing Sheets

US 8,642,941 B2

PHOTONIC INTEGRATED CIRCUIT WITH INTEGRATED OPTICAL TRANSCEIVER

CROSS-REFERENCE TO RELATED APPLICATIONS

This application claims priority to U.S. Provisional Application Ser. No. 61/334,057 filed May 12, 2010 and European Patent Application Serial No. EP 10177399.2 filed Sep. 17, 2010. The contents of each are hereby incorporated by reference.

FIELD OF THE INVENTION

The invention relates to the field of photonic integrated circuits and methods of manufacturing and using them. More particularly, the present invention relates to a system comprising a photonic integrated circuit comprising a photodetector, such as a III-V semiconductor photodetector, a radiation source, such as a III-V semiconductor laser, and to optical emitters, receivers or transceivers wherein such optical elements are integrated on a photonic integrated circuit, such as a silicon based photonic integrated circuit.

BACKGROUND

In the Fiber-to-the-Home (FTTH) market, two technologies are competing: passive optical networks (PON) and Ethernet-based point-to-point networks. The European market is mostly directed to Ethernet-based point-to-point networks. The Japanese and to a lesser extent the US markets mainly works with PON. Ethernet point-to-point has considerable advantages over PON: Ethernet is an open standard, upgrading is easier and the network is future-proof. However, PON has a strong advantage as well: since PON networks are shared between end-users, the space and power consumption required for the central office is much smaller. In addition, the cost of the PON central office equipment is less than for point-to-point access switches. Reducing the size, power consumption and cost of Ethernet-based central office equipment (which consists of an individual transceiver per user) would therefore take away important drawbacks of point-to-point networks.

Photonic integrated circuits allow integrating multiple optical components on a single chip, thereby realizing the required reduction in size, cost and power consumption for the central office equipment. Contrary to traditional platforms for photonic integration such as III-V monolithic integration, which requires expensive regrowth techniques, or silica-on-silicon, which is not compatible with a compact form-factor, the silicon platform seems the only one which is truly compatible with large scale integration. This is due to the high refractive index contrast that is available in so called silicon photonic wires, allowing for wavelength scale routing and handling of light on the silicon-on-insulator chip. Wafer-level processing using CMOS fabrication tools and wafer level testing may enable low cost levels.

Using high index contrast photonic integrated circuits for communication applications however also bring along considerable challenges, especially regarding the efficient fiber-to-chip coupling and polarization independent operation of the photonic integrated circuit, and the need for handling widely spaced wavelength bands. Efficient optical coupling (−1.6 dB) between a single mode fiber and a silicon photonic wire has been demonstrated using a diffractive grating structure for a single polarization in the optical fiber. However, the 1 dB optical bandwidth is limited to 50 nm. In order to address the polarization sensitivity of the grating coupler, a polarization diversity approach has been presented using two-dimensional grating couplers to couple both orthogonal polarizations to the silicon chip. While this allows reducing the polarization dependent loss, it also only works over a limited wavelength range, which is insufficient for Fiber-to-the-Home (FTTH) transceiver applications.

In fibre-to-the-home (FTTH) optical networks, the upstream and downstream signals are typically sent over the same fiber, e.g. single mode fiber, but at a different wavelength. The upstream signals typically use a wavelength band around 1310 nm (1260 nm-1360 nm). The downstream signals typically use a wavelength band around 1490 nm (1480 nm-1500 nm). In FTTH transceiver applications, a 100 nm wide wavelength band needs to be covered in the 1310 nm wavelength range. Moreover, the two-dimensional grating approach introduces a decrease in fiber-to-chip coupling efficiency. In a FTTH transceiver at the end of the optical fibers, these 2 wavelengths need to be multiplexed and demultiplexed. The transceiver in the central office transmits 1490 nm and receives 1310 nm. The transceiver in the subscriber's home/building transmits 1310 nm and receives 1490 nm.

Sometimes the downstream signal also consists of 2 wavelength bands, one around 1490 nm and one around 1550 nm. This is illustrated in FIG. 1, indicating the upstream optical signal 2 being in a first wavelength range and the downstream optical signals 4 being in a second wavelength range comprising two downstream optical signals 6 in sub-wavelength ranges. In that case, these two downstream signals also need (de)multiplexing in the transceiver. Such (de)multiplexing may be implemented in a silicon-on-insulator photonic integrated circuit.

Since the FTTH transceivers require photodetection and light emission on the photonic integrated circuit, other materials than silicon need to be integrated in order to perform these functions. Ge-based photodetectors are a good option given their direct compatibility with the CMOS compatible processing of the silicon photonic integrated circuit. Another approach is using a heterogeneously integrated III-V semiconductor photodetector. This approach has the advantage that it also allows the integration of III-V light sources and III-V modulators on the same photonic integrated circuit.

In these approaches the 1310 nm band needs to be coupled into a waveguide, guided and detected in a highly efficient, polarization independent way and over a large wavelength span (e.g. 100 nm). In addition, the 1490 nm and 1550 nm light needs to be coupled out and demultiplexed from the incoming light. This approach makes it hard to reach the required specification for FTTH transceivers.

SUMMARY

It is an object of embodiments of the present invention to provide good transceivers, that allow efficient emission or detection of optical signals, while at the same time having efficient coupling of optical signals received in or emitted from the transceiver respectively. It is an advantage of embodiments according to the present invention that efficient multiplexing between radiation to and from the transceiver can be obtained. It is an advantage of embodiments according to the present invention that multiplexing between radiation to and from the transceiver can be obtained without the need for a grating, e.g. by using a transparent component for emitting or detecting radiation in a particular wavelength range while allowing transmission of the radiation through the transparent component for radiation to be processed in the system in another wavelength range.

In one set of embodiments according to the present invention, it is an advantage that efficient detection of optical signals with low polarization dependent losses within a first predetermined wavelength band having a width up to the order of 100 nm, e.g. in the order of 100 nm, as well as efficient coupling of optical signals having a wavelength in a second predetermined wavelength band different from the first predetermined wavelength band can be obtained.

In another set of embodiments according to the present invention, it is an advantage that efficient emission of optical signals in a first predetermined wavelength band, having a width up to the order of 100 nm e.g. in the order of 100 nm, as well as efficient detection of optical signals having a wavelength in a second predetermined wavelength band, different from the first predetermined wavelength band can be obtained.

The above objective is accomplished by a method and device according to the present invention.

In a first aspect, the present invention relates to a photonic structure for processing radiation, the photonic structure comprising at least a first optical component for detecting radiation of a first wavelength range received from an external radiation guide or generating and directing radiation of a first wavelength range to an external radiation guide, the first optical component being substantially transparent for radiation of a second wavelength range, different from the first wavelength range, and the photonic structure furthermore being configured for free-space coupling radiation of said second wavelength range through said optical component into or out of the photonic structure. The photonic structure furthermore is adapted for optically guiding radiation of the second wavelength range in the photonic structure away from or towards the first optical component. It is an advantage of embodiments according to the present invention that efficient generation or detection of radiation of a first wavelength range can be performed while at the same time efficient detection respectively generation of radiation of the second wavelength range also is obtainable. The photonic structure may be a transceiver wherein the first optical component may be adapted for receiving or sending emission of a first wavelength and wherein the photonic structure may be configured for respectively sending or receiving emission of a second wavelength range substantially unaffected by the first optical component. It is an advantage of embodiments according to the present invention that multiplexing can be obtained away from a single coupling component e.g. by direct detection or generation of radiation of a first wavelength range while handling radiation of the second wavelength range at a spatially distinct different position. The photonic structure may comprise a photonic integrated structure and the first optical component may be monolithically, heterogeneously or hybridly integrated on the photonic integrated structure. The photonic integrated circuit may be a silicon based photonic integrated circuit. It is an advantage of embodiments according to the present invention that a compact photonic structure can be obtained wherein receiving as well as emitting radiation towards an external radiation guide can be done efficiently, e.g. without substantial polarization dependent loss. The photonic structure may be adapted for optically guiding the radiation of the second wavelength range in the photonic structure by comprising a coupling structure and a waveguide, whereby the first optical component may be positioned between the external radiation guide and the coupling structure and wherein the coupling structure may be arranged for receiving the radiation of the second wavelength range and coupling the radiation to or out of said waveguide. It is an advantage of embodiments according to the present invention that only radiation to be emitted by the photonics system or to be detected by the photonics system needs to be coupled to or from the photonics system using a coupling structure such as a grating coupler.

The first optical component may be a detector or a radiation source and the photonic structure furthermore may comprise a second optical component being a radiation source respectively a detector for generating respectively detecting radiation of the second wavelength range. It is an advantage of embodiments according to the present invention that both the functionality of radiation detection and radiation generation of the transceiver can be performed in a compact photonic structure, advantageously a compact photonic integrated structure.

The first optical component and the second optical component may be positioned on top of each other. It is an advantage of embodiments according to the present invention that a transceiver with a small footprint can be made.

The first optical component may be a detector, the detector being adapted for absorbing radiation within said first wavelength range and the detector may be substantially transparent to radiation within said second wavelength range.

The first optical component may be a radiation source, the radiation source being adapted for generating radiation within said first wavelength range and the radiation source being substantially transparent to radiation within said second wavelength range.

The first optical component may be a III-V semiconductor device. It is an advantage of embodiments according to the present invention that III-V semiconductor devices can be relatively easy integrated in a photonics system.

The present invention also relates to a method for processing radiation, the method comprising: detecting radiation of a first wavelength range received from an external radiation guide or generating and directing radiation of a first wavelength range to an external radiation guide using a first optical component, free space coupling radiation from within a second wavelength range, different from the first wavelength range, into or out of the photonic structure through the first optical component, the first optical component being transparent for radiation from within the second wavelength range, and optically guiding the radiation of said second wavelength range in the photonic structure away from or towards the first optical component.

The detecting or generating may comprise detecting radiation of a first wavelength range received from an external radiation guide using a detector and the method may comprise generating radiation within a second wavelength range in a photonics system and coupling out said radiation within a second wavelength range from the photonics system through said detector, the detector being substantially transparent for said radiation within the second wavelength range.

The detecting or generating may comprise generating radiation within a first wavelength range and directing it towards an external radiation guide using a radiation source and the method may comprise detecting radiation within a second wavelength range in a photonics system through said radiation source, the radiation source being substantially transparent for the radiation within the second wavelength range.

It is an advantage of embodiments according to the present invention that these can advantageously be used for Fiber-to-the-Home (FTTH) central office transceivers in a point-to-point network configuration, wherein the first predetermined wavelength band is the 1260 nm to 1360 nm and wherein the second predetermined wavelength band comprises the 1490 nm and 1550 nm wavelengths.

In one aspect, the present invention also relates to embodiments describing photodetectors, for example III-V semiconductor photodetectors, that can detect (absorb) optical signals having a wavelength in a first predetermined wavelength band, the photodetectors being substantially transparent to optical signals having a wavelength in a second predetermined wavelength band, the second predetermined wavelength band being different from the first predetermined wavelength band.

Alternative embodiments refer to radiation sources, for example III-V semiconductor radiation sources, that can emit optical signals having a wavelength in a first predetermined wavelength band, the radiation sources being substantially transparent to optical signals having a wavelength in a second predetermined wavelength band, the second predetermined wavelength band being different from the first predetermined wavelength band.

The present disclosure furthermore relates to devices, e.g. transceivers, comprising a transparent optical component according to embodiments of the present invention and to circuits comprising a photonic integrated circuit, for example a silicon based photonic integrated circuit, and a transparent optical component, for example a III-V semiconductor photodetector or radiation source, according to an embodiment of the present invention, wherein the photodetector or radiation source is integrated with the photonic integrated circuit.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
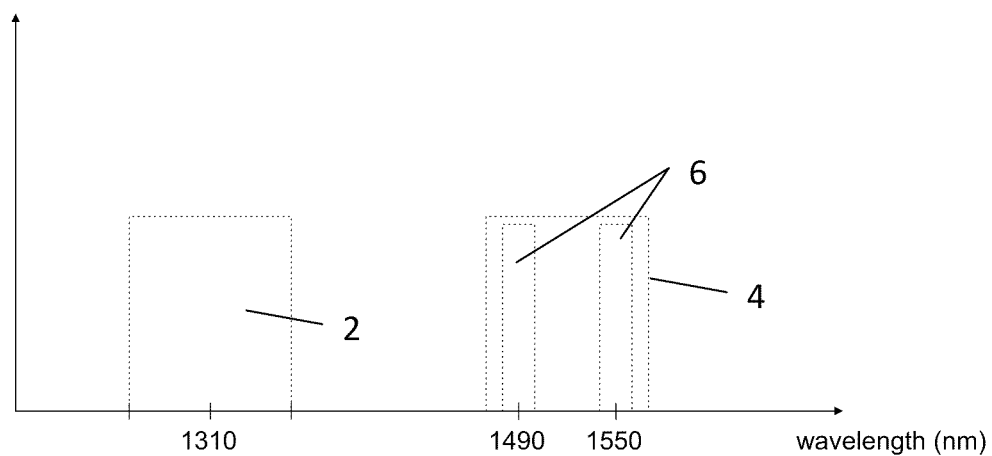
FIG. 1 illustrates upstream and downstream wavelength bands as may be used in accordance with an embodiment.

The drawings are merely schematic and are not meant to be limiting. In the drawings, the size of some of the elements may be exaggerated and not drawn on scale for illustrative purposes. Any reference signs in the claims shall not be construed as limiting the scope. In the different drawings, the same reference signs refer to similar or analogous elements.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be understood that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components or groups thereof. Thus, the scope of the expression "a device comprising means A and B" should not be limited to devices consisting only of the components A and B.

In the disclosure, where reference is made to a photonics integrated circuit (PIC), this may refer to a variety of forms and material systems such as, for example, low-index contrast waveguide platforms (e.g. polymer waveguides, glass/silica waveguides, $Al_xGa_{1-x}As$ waveguides, $In_xGa_{1-x}As_yP_{1-y}$ waveguides), high-index contrast waveguides (e.g. Silicon-on-Insulator, semiconductor membranes), plasmonic waveguides (e.g. metal nano-particle arrays, metal layers), also called Photonic Lightwave circuits (PLC).

In some embodiments, the disclosed photonic integrated circuit comprises at least a detector or a radiation source monolithically, heterogeneously or hybridly integrated, although embodiments are not limited thereto. For example, further optical components also may be included, such as for example but not limiting to an integrated optical cavity, an integrated optical resonator, an integrated optical interferometer, an integrated optical coupler, a waveguide, a taper, a tuneable filter, a phase-shifter, a grating, a modulator, a multiplexer, a demultiplexer or a combination thereof. Such further optical components can be active or passive. The components can be integrated for example monolithically, heterogeneously or hybridly. Monolithical integration is the integration technology that uses a single processing flow to process the diverse components potentially using different materials, e.g. integrated germanium detectors in silicon photonics IC. Heterogeneous integration is the integration technology for which the components are processed in separate process flows, which are then integrated at die or wafer level, e.g. BCB bonding, wafer bonding, and other bonding schemes, 3D integration. Hybrid integration is the integration of components or materials on processed photonic integrated platforms, e.g. flip-chipping of detectors, bumping, gluing, wire bonding, co-packaging, etc.

The disclosed structures and methods are described for the particular case of an SOI (Silicon-on-Insulator) material system, also referred to as silicon photonics system. Those of ordinary skill in the art will recognize, however, that the devices and methods of the present invention could similarly be based on other material systems, such as for example III-V material systems, metallic layers, low index contrast material systems or a combination thereof.

Silicon-on-Insulator is a very interesting material system for highly-integrated photonic circuits. Use of Silicon-on-Insulator also offers some technological advantages. For example, due to the CMOS industry, silicon technology has reached a level of maturity that outperforms any other plane chip manufacturing technique by several orders of magnitude in terms of performance, reproducibility and throughput. Nano-photonic integrated circuits can be fabricated with wafer scale-processes in which a single wafer can contain a large number of photonic integrated circuits. Combined with the commercial availability of large wafers at a relative moderate cost, this means that the price per photonic integrated circuit can be very low.

In the disclosure, where reference is made to an optical component being substantially transparent for radiation within a wavelength range, the optical component may transmit, for example, at least 50% of radiation in that wavelength range. In other examples, the optical component may transmit at least 70% of radiation in that wavelength range, or even at least 80% of radiation in that wavelength range. Other examples are possible as well.

Embodiments according to the present invention are not restricted to the exact wavelength range used, or in other words, the wavelength ranges used may be selected in view of an envisioned application. In some embodiments selection of these wavelength ranges is made within the infrared radiation range, although embodiments of the present invention are not limited thereto and the invention can also be applied in other wavelength ranges.

In the disclosure, where reference is made to radiation unaffected by an optical component, the radiation may be merely substantially not absorbed by the optical component. Radiation may be said to be substantially not absorbed if, for example, at least 50% of radiation in that wavelength range is not absorbed. In other examples, radiation may be said to be substantially not absorbed if at least 70% of radiation in that wavelength range is not absorbed, or even if at least 80% of radiation in that wavelength range is not absorbed. Other examples are possible as well.

The disclosed structures may be used for, for example, FTTH transceivers, leading to at least one or more of a reduced cost, reduced complexity, reduced footprint and/or better performance as compared to prior art FTTH transceivers.

In the disclosure, where reference is made to free space coupling, the coupling may be coupling of electromagnetic radiation in free space, i.e. not being guided in a conductor.

Figure 2:
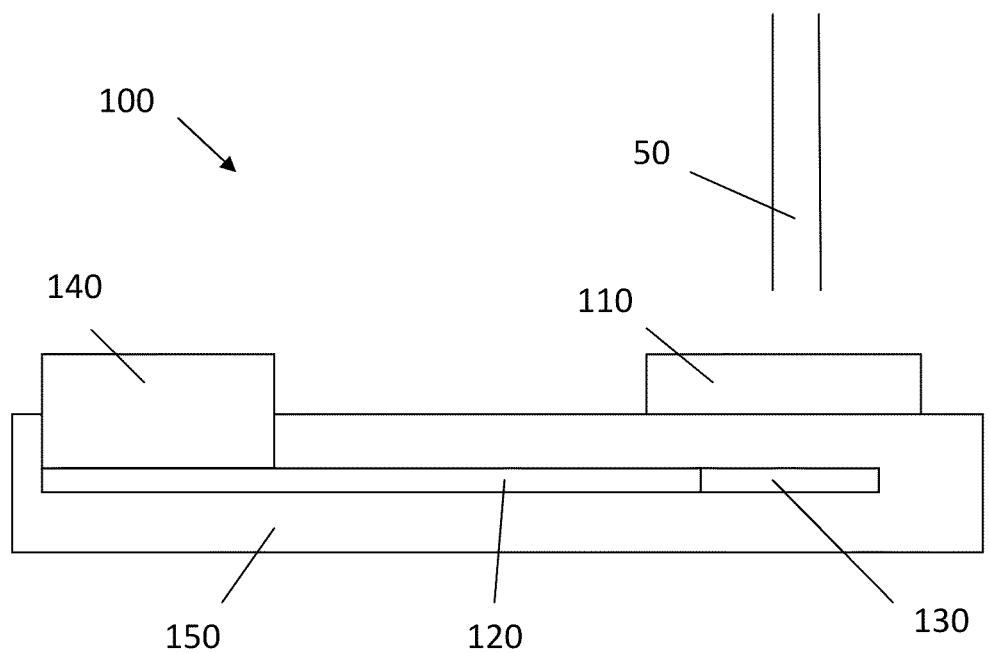
FIG. 2 schematically shows an optical system in which emission or detection is performed by a transparent optical component while the radiation to be detected or emitted respectively is coupled through the transparent optical component further into the optical system, in accordance with an embodiment.

In a first aspect, the present invention relates to a photonic structure for processing radiation. Such photonic structure may advantageously be used in FTTH transceivers, although embodiments of the present invention are not limited thereby and such embodiments can also be applied for other applications, such as transceivers in other applications like optical cables, integration of elements, such as e.g. solar cells, on a photonic integrated circuit for autonomic operation, etc. The different components, standard and optional components, of an exemplary photonic structure according to one embodiment of the present invention and part of the environment in which it is used are schematically illustrated in FIG. 2. In the embodiment shown, the photonic structure 100 comprises a first optical component 110 for detecting radiation of a first wavelength range received from an external radiation guide such as an optical fiber. In other embodiments, the first optical component 110 may be configured for generation and directing radiation of a first wavelength range to an external radiation guide. This first optical component 110 thus is either a transparent detector for detecting radiation or a transparent radiation source for generating and directing radiation.

The radiation is received from or sent to an external radiation guide 50, which, in some embodiments, may be separate from the photonic structure 100. The external radiation guide 50 may be an optical fiber, although embodiments of the present invention are not limited thereto. Sending radiation of the first wavelength range to or receiving it from the external radiation guide 50 may be through free space coupling between the external radiation guide 50 and the first optical component 110. Other types of coupling are possible as well.

The first optical component 110 typically may be adapted for processing, i.e. generating or detecting, radiation within a first wavelength range while being transparent for radiation within a second wavelength range. Advantageously, the first optical component 110 may be monotlithically, heterogeneously or hybridly integrated in the photonics system 100, such as on a photonics substrate 150. Depending on whether the first optical component 110 is a detector or a radiation source, the first optical component 110 may take various forms.

In embodiments where the first optical component 110 is a transparent detector, the first optical component 110 may be a photodetector, such as a III-V semiconductor photodetector). Other transparent detectors also could be used, such as, for example, germanium detectors (transparent for wavelengths larger than 1.6 µm), silicon detectors (transparent for wavelengths larger than 1.1 µm), SiGe detectors (tunable absorption edge between the absorption edges of silicon and germanium), II-VI and IV-VI semiconductors for mid-IR radiation, etc. By way of illustration, more particular examples will be described in further embodiments.

In embodiments where the first optical component 110 is a transparent radiation source, the first optical component 110 may be a laser, such as a vertically emitting laser or a side emitting laser. The laser may be a III-V semiconductor laser, although embodiments of the present invention are not limited thereto. Other transparent laser also could be used, such as for example IV-VI lasers, II-VI lasers, etc.

The photonic structure 100 furthermore may be configured for coupling radiation of the second wavelength range through said optical component 110 into or out of the photonic structure 100. The coupling may be free space coupling radiation of the second wavelength range through the first optical component into or out of the photonic structure. The photonic structure 100 also may be further configured for optically guiding the radiation of the second wavelength range in the photonic structure respectively away from the first optical component 110, e.g. when the radiation has been free space coupled in through the first optical component, or towards the first optical component 110, e.g. when the radiation is to be coupled out through the first optical component. Optically guiding may be performed using one or more optical elements integrated in the photonic structure, such as for example a coupling structure and a waveguide, an integrated lens, etc.

The photonic structure may, in some embodiments, be provided with a coupling structure 130 for coupling radiation into or out of the photonic structure 100 after or prior to transmitting the radiation through the transparent first optical component 110. Such a coupling structure 130 may be any suitable coupling structure such as, for example, a grating structure, a spotsize converter, a 45° mirror, or other coupling structure.

In some embodiments, the photonics structure 100 may also comprise a second optical component 140 for performing either detection or radiation generation, whichever is not performed by the first optical component 110. (For example, if the first optical component 110 is a detector, the second optical component 140 may be a radiation source, or vice versa.) Any suitable optical component may be used. The second optical component 140 may be monolithically, heterogeneously or hybridly integrated in the photonics structure 100. Radiation from or to the second optical component 140 may be guided in the photonic structure 100 using one or more waveguides 120. In some embodiments, the photonic structure 100 may be a photonics integrated circuit, such as for example a silicon-based photonics integrated circuit. The photonic structure 100 may comprise additional components as well.

By way of illustration, embodiments of the present invention not being limited thereby, further possibilities, details and advantages of one, more or particular embodiments of the present invention will be discussed below.

In one embodiment of a photonics system, a transparent detector may be used for detecting radiation received from an external radiation guide, such as an optical fiber, while radiation within another second wavelength range can be coupled out from the photonics system through the transparent detector. The photonics system may be used for FTTH applications, although embodiments of the present invention are not limited thereto. In an FTTH application, the first wavelength band may be, for example, a wavelength band around 1310 nm, such as a wavelength band between 1260 nm and 1360 nm. The second predetermined wavelength band may be, for example, a wavelength band between 1490 nm±20 nm and 1550 nm±20 nm.

Figure 3:
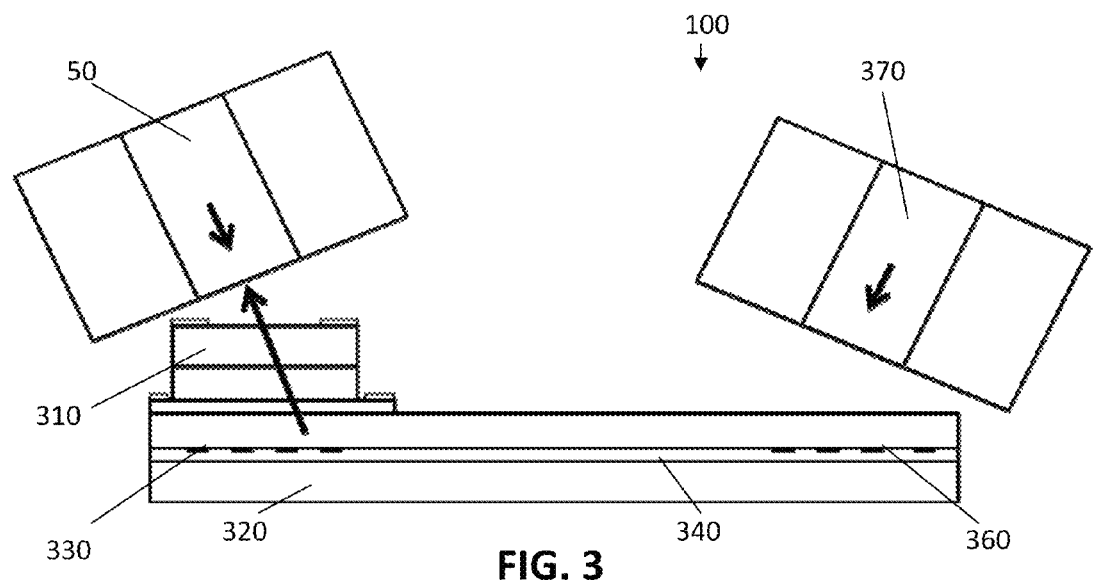
FIG. 3 schematically shows a cross-section of a III-V/SOI transceiver in accordance with an embodiment.

FIG. 3 schematically shows a cross-section of a first exemplary transceiver 100 according to a particular embodiment of the present invention, the transceiver 100 comprising a III-V semiconductor photodetector 310 integrated above a coupling structure 330 (e.g., a 1D grating coupler, as in the example shown) on a silicon based photonic integrated circuit 320. The III-V semiconductor photodetector 310 can be used for detecting optical signals, such as optical signals provided from an optical fiber 50, within a first wavelength band around 1310 nm (for example a wavelength band between 1260 nm and 1360 nm). Furthermore, the photodetecor 310 is transparent for the 1490 nm wavelength channel (1470 nm to 1510 nm) and for the 1550 nm wavelength channel (1530 nm to 1570 nm). Therefore, optical signals in the 1490 nm to 1550 nm band can be coupled out of the photonic integrated circuit 320 by the coupling structure 330 (e.g. grating coupler) underneath the photodetector 310, transmitted through the photodetector 310 and coupled into the same optical fiber 50, as illustrated in FIG. 3.

In the example shown in FIG. 3, the III-V semiconductor layer forming the detector 310 stack comprises an n-type InP/InGaAsP/p-type InP p-i-n structure with an absorption layer having a band gap wavelength of 1.37 µm. This bandgap wavelength allows the 1310 nm wavelength band to be efficiently absorbed, while the absorption layer is transparent for the 1490 nm and 1550 nm wavelength channels. To make the detector 310 transparent for these wavelength channels, the III-V layer stack thicknesses are preferably optimized for maximum transparency at the central wavelength of 1520 nm.

In the configuration shown in FIG. 3, the III-V semiconductor photodetector 310 is provided (heterogeneously integrated) on top of a grating coupler structure 330 in a silicon waveguide layer 340, being part of a silicon-on-insulator photonic integrated circuit 320, and allowing radiation to be received from a radiation source, in the present example being an external radiation source for which the radiation is coupled in the photonics integrated circuit 320 via a separate grating 360 using a separate optical fiber 370 for transporting the radiation to the photonic integrated circuit 320. The photonic integrated circuit 320 in the present example thus may comprise the silicon waveguide layer, which can include a multiplexer, a modulator, etc.

It is an advantage of this configuration that it allows efficient detection with low polarization dependent losses over the full 1260 nm-1360 nm wavelength band of the radiation to be detected, since light in this wavelength band is not coupled to the silicon waveguide layer but directly detected in the optical detector 310. On the other hand, the 1490 nm/1550 nm wavelength channels (which can be generated on chip and therefore can have controlled polarization and better controlled emission wavelength) can be efficiently coupled from the silicon waveguide layer 340 to the same optical fiber 50 as the one used for receiving radiation using a one-dimensional diffractive structure (operating for a single polarization) 330.

A photodetector 310 according to embodiments of the present invention can also be used in other configurations. For example, the photodetector 310 can be provided over the output window of a light emitting device such as a vertical-cavity surface-emitting laser (VCSEL).

Figure 4:
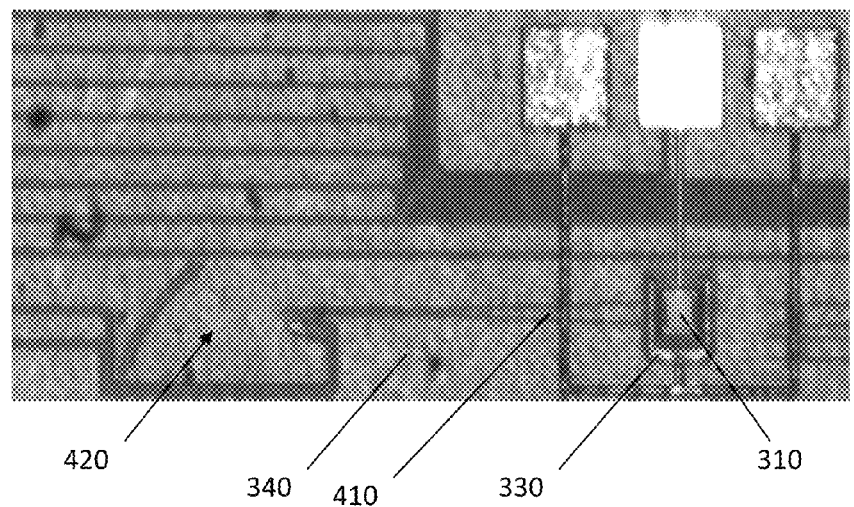
FIG. 4 is a microscope image of a III-V/SOI transceiver circuit in accordance with an embodiment.

The structure shown in FIG. 3 was fabricated, using a process wherein a III-V heterostructure was bonded on top of the silicon grating coupler 330 using benzocyclobutene (DVS-BCB) adhesive wafer bonding. After layer transfer, the III-V photodetector 310 was processed, and lithographically aligned to the underlying silicon-on-insulator waveguide 340 circuit. A microscope image (top view) of such a structure is shown in FIG. 4. The III-V photodetector 310 was processed on top of a silicon-on-insulator waveguide 340 circuit consisting of a planar concave grating 330 capable of multiplexing a 1490 nm band data signal and a 1550 nm band data signal in a single output waveguide. The devices were fabricated using standard CMOS fabrication tools on an 8 inch SOI wafer comprising a 220 nm silicon waveguide layer and buried oxide layer with a thickness of 2 micrometer. Further an adiabatic taper 410 was provided for guiding the radiation to be coupled out towards the grating structure 330. A further component visible in the photonics integrated circuit is a PCG demultiplexer 420 for multiplexing the radiation to be coupled out of the photonics system.

Other fabrication processes known to a person skilled in the art can be used for fabricating a device or a circuit according to the present disclosure. For example, a standalone photodetector 310 can be provided (e.g. through a flip-chip process) on the coupling structure 330.

Figure 5:
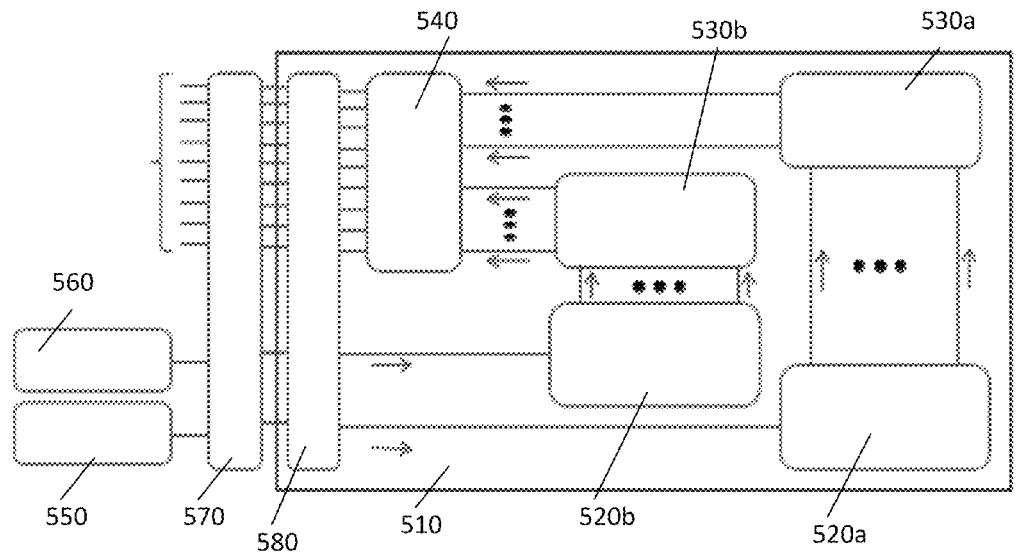
FIG. 5 shows a device configuration for integrated transceiver arrays for Fiber-to-the-home central office equipment.

FIG. 5 shows a device configuration for integrated transceiver arrays for FTTH central office equipment. The functionality on the silicon platform 510 (silicon chip) can be enhanced by adding integrated power splitters 520*a*, 520*b* (e.g. 1×N splitters), arrays of 1490 nm and 1550 nm modulators 530*a*, 530*b* and wavelength multiplexers 540 to realize integrated transceiver arrays (e.g. 8 channels) for central office equipment with a single CW external light source (VCSEL or distributed feedback (DFB) laser, such as e.g. a 1490 nm continuous wave (CW) laser and a 1550 nm CW laser) per wavelength band 550, 560, as shown in FIG. 5. The radiation may be coupled in and out through a fiber array 570 using a fiber-coupler array 580.

Figure 6A:
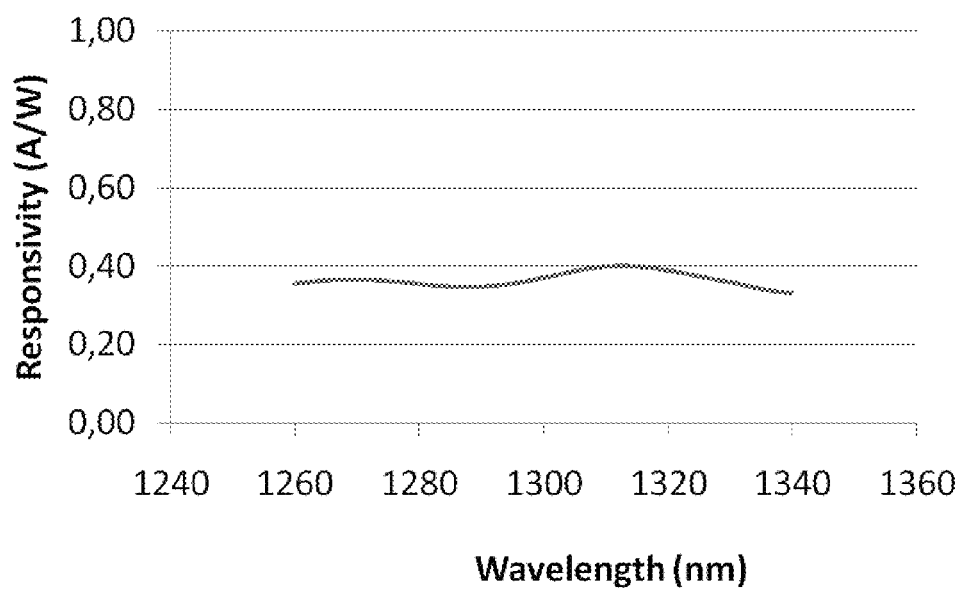
FIG. 6(a) shows the responsivity in the 1310 nm wavelength band for a photodetector and FIG. 6(b) shows the associated polarization dependent loss, in accordance with an embodiment.
Figure 6B:
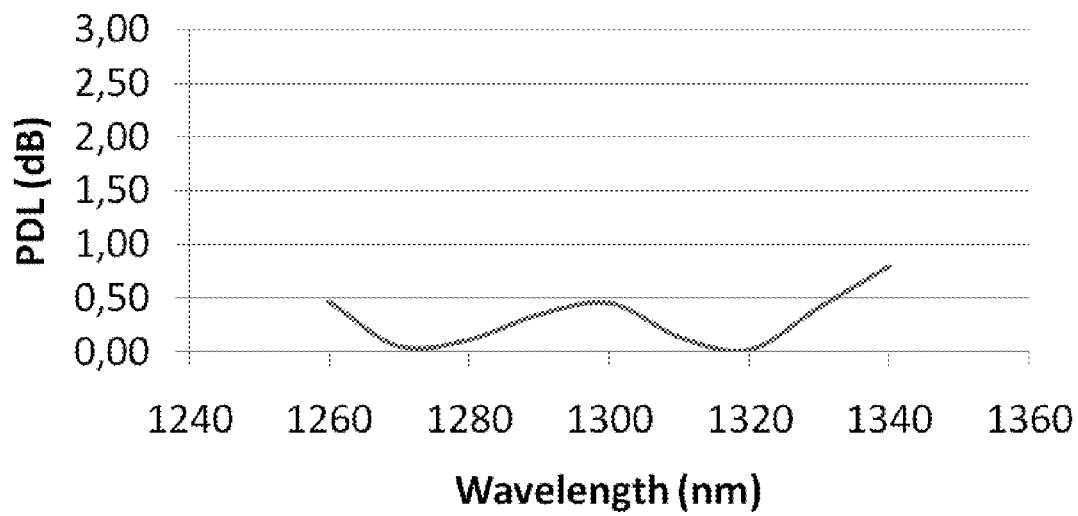

The fabricated devices where characterized in the 1310 nm and 1490 nm to 1550 nm wavelength bands. For this proof-of-principle device, a standard silicon diffractive grating structure was used with a known fiber-to-chip coupling efficiency of −6 dB. The implementation of advanced fiber-to-chip couplers with a fiber-to-chip coupling efficiency of e.g. up to −1.6 dB is expected not to affect the operation principle of the proposed device. The optical fiber in the present example is tilted 10 degrees off vertical in order to avoid second order Bragg reflection from the silicon grating. FIG. 6(*a*) shows the responsivity of the photodetector for the 1310 nm wavelength band. Over the entire wavelength band the responsivity is close to 0.4 A/W. The polarization dependent loss (PDL) is plotted in FIG. 6(*b*), showing excellent behavior (<0.5 dB PDL) over the full wavelength range.

Such a low PDL would have been very hard to obtain when the 1310 nm channel had to be coupled to the silicon waveguide circuit and demultiplexed from the 1490 nm/1550 nm signal prior to photodetection (as typically in prior art solutions). Assuming an external laser source for the 1490 nm/1550 nm upstream channel (from the viewpoint of the central office equipment), the fiber-to-fiber transmission of the fabricated photonic integrated circuit (using two identical grating couplers of which one is covered by the heterogeneously integrated photodetector as illustrated in FIG. 3) was measured. A peak transmission of −12 dB, consistent with the −6 dB fiber-to-chip coupling efficiency of a single grating, was obtained. This shows that the integration of the photodetector on top of the fiber coupler has no adverse affect on its performance in the 1490 nm/1550 nm wavelength range.

Figure 7:
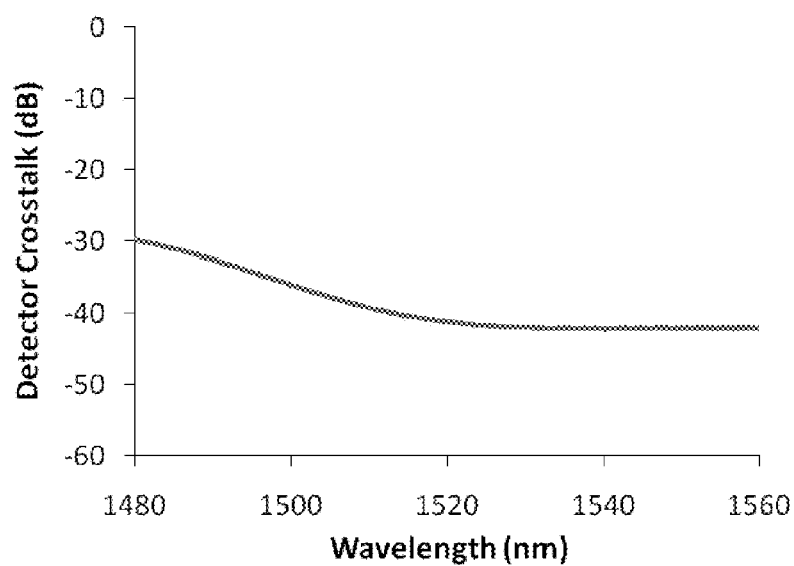
FIG. 7 shows the photodetector cross-talk due to the transmission of a 1490 nm/1550 nm data signal.

In order to assess the transparency of the integrated photodetector for the 1490 nm/1550 nm wavelength channel and in order to assess electrical crosstalk effects in the photodetector, the device responsivity was also characterized in the 1490 nm/1550 nm wavelength band. This crosstalk, defined as the ratio between the responsivity at a wavelength in the 1490 nm/1550 nm wavelength range to a typical responsivity of 0.4 A/W in the 1310 nm wavelength range is shown in FIG. 7, and is below −30 dB. Therefore, even in case of a significant difference in optical power between the point-to-point downstream 1310 nm wavelength channel and the upstream 1490 nm/1550 nm wavelength channel of 10 dB, a better than −20 dB crosstalk in the photodetector is obtained, illustrating the feasibility of this approach. The planar concave grating, used to multiplex the 1490 nm and 1550 nm wavelength channels works as expected after photodetector integration.

By way of illustration, embodiments of the present invention not being limited thereto, a number of particular embodiments wherein a transparent radiation source, such as for example a laser, as optical transparent component is used, are also discussed.

Figure 8:
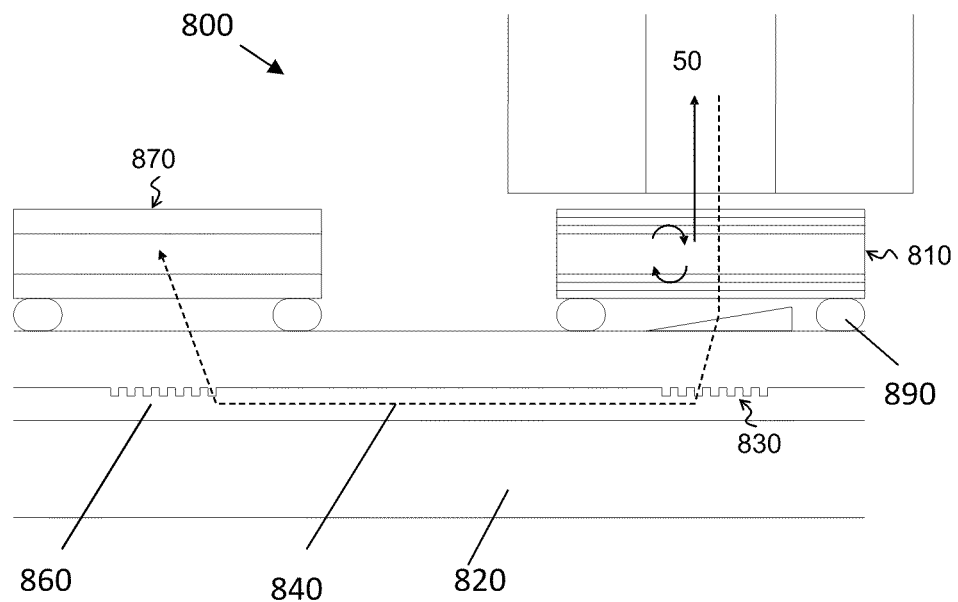
FIG. 8 illustrates an example of an optical system using a vertically emitting laser and III-V detector, in accordance with an embodiment.

In one particular embodiment, a transceiver is described wherein the transparent radiation source is a vertically emitting III-V semiconductor laser, integrated above a coupling structure on a silicon based photonics integrated circuit, as shown schematically in FIG. 8. In particular, FIG. 8 shows a cross-section of an exemplary transceiver 800.

The transceiver 800 is adapted for coupling radiation of a first wavelength range to an optical fiber 50 and for receiving radiation of at least a second wavelength range, different from the first wavelength range from the optical fiber 50. The radiation of the first wavelength range is generated in the optical radiation source 810 (as shown, a vertically emitting III-V semiconductor laser) and emitted into the optical fiber 50. The radiation source 810 in the present example is integrated on a photonics substrate 820.

The transceiver 800 is furthermore adapted for receiving radiation from the second wavelength range, without substantial absorption, through the radiation source. In the present example the radiation is detected in a photodetector 870 after it has been transmitted through the radiation source 810, coupled by a first coupling structure 830 into an underlying waveguide 840 and coupled out by a second coupling structure 860 into the photodetector 870. The underlying waveguide 840 in the present example is made in a Silicon-on-Insulator layer supported by a substrate 820. The coupling structures in the present example are grating structures.

The radiation source 810 thus is, in the present example, positioned between the optical fiber 50 and the first coupling structure 830 for coupling in the radiation from the optical fiber 50, such that the radiation received from the fiber 50 first is transmitted through the radiation source 810. The radiation source 810 thus is integrated above a coupling structure 830 on a silicon based photonic integrated circuit. The radiation source can for example be flip-chipped using metal bumps 890 (as drawn in FIG. 8) or integrated using wafer bonding or adhesive bonding. The radiation source 810 can be used for emitting optical signals, e.g. to a fiber 50, within a first wavelength band around 1310 nm. Furthermore, the laser 810 is transparent for the 1490 nm wavelength band and/or the 1550 nm wavelength band. Therefore optical signals in the 1490/1550 band can be coupled from the fiber 50 (through the transparent laser) into the photonic integrated circuit and further into a photodetector 870.

To obtain a laser 810 that is transparent for the 1490 nm wavelength band, two conditions have to be fulfilled. The materials used have to be transparent (low absorption in the 1490 nm wavelength band). Also the mirrors of the laser have to be transparent (low reflection in the 1490 nm wavelength band). By way of illustration, an example of a radiation source, in the present example being a vertically emitting laser, is shown in FIG. 9.

Figure 9:
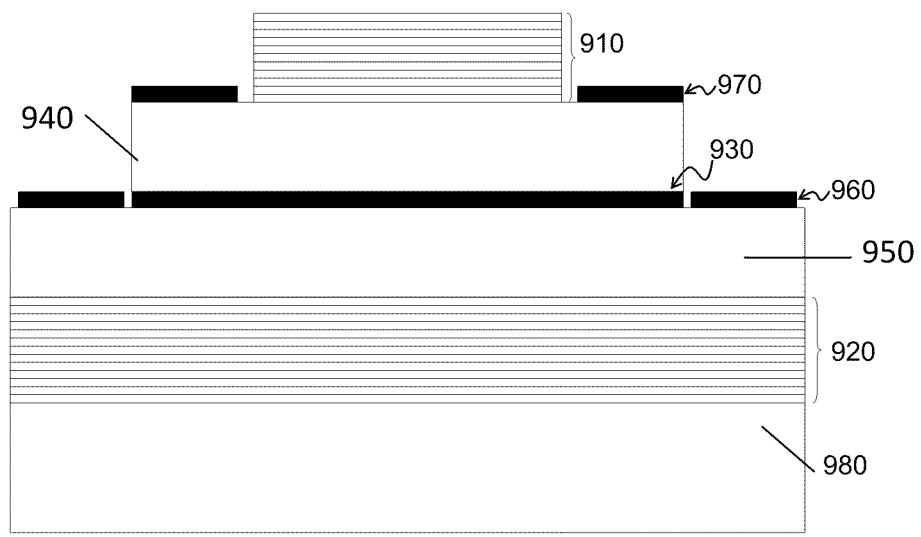
FIG. 9 illustrates an example of a cross-section of a transparent vertically emitting laser, in accordance with an embodiment.

As shown in FIG. 9, the radiation source 900 includes a top distributed Bragg reflector (DBR) mirror 910 and bottom DBR mirror 920, an active layer 930 and several buffer layers 940, 950 and/or contact layers, e.g. metal contact layers 960, 970, in between. The active layer can be an AlGaInAs multi quantum well (MQW); quantum wells have a relatively narrow gain spectrum and consequently the absorbtion in the 1490 nm band can be low if the laser is designed to emit at 1310 nm. The radiation source is made on a substrate 980.

Figure 10:
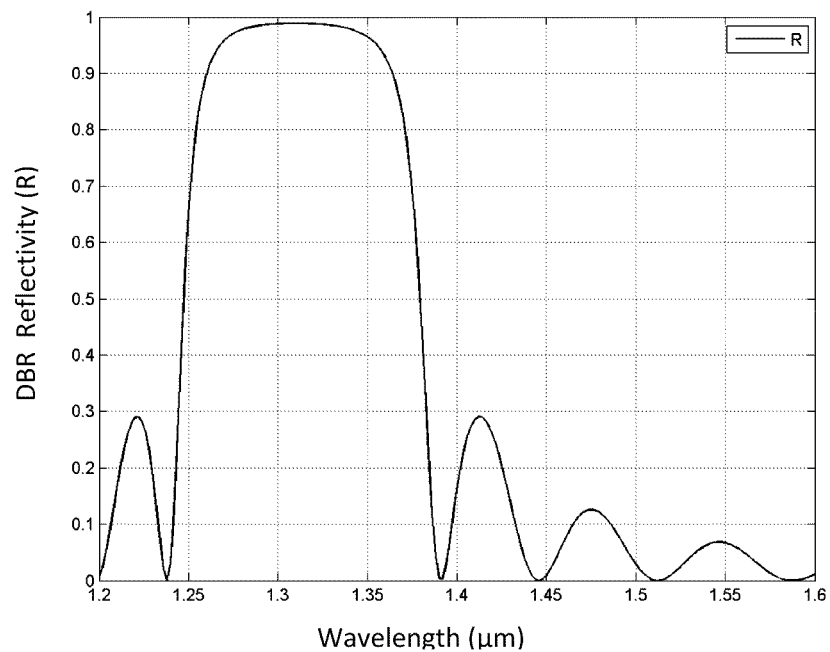
FIG. 10 illustrates the reflectivity of a mirror of a vertically emitting laser, in accordance with an embodiment.

FIG. 10 illustrates the reflectivity of a mirror of a vertically emitting laser, in accordance with an embodiment. In particular, FIG. 10 illustrates the reflectivity of a (24 pair GaAs/AlAs DBR mirror). As shown, around 1310 nm wavelength, the reflectivity is very high >98%. In the 1490 nm wavelength range, the reflectivity is low <15%. If required, the reflectivity in the 1490 nm wavelength band may be further reduced by optimizing the layer stack of the mirror.

Figure 11:
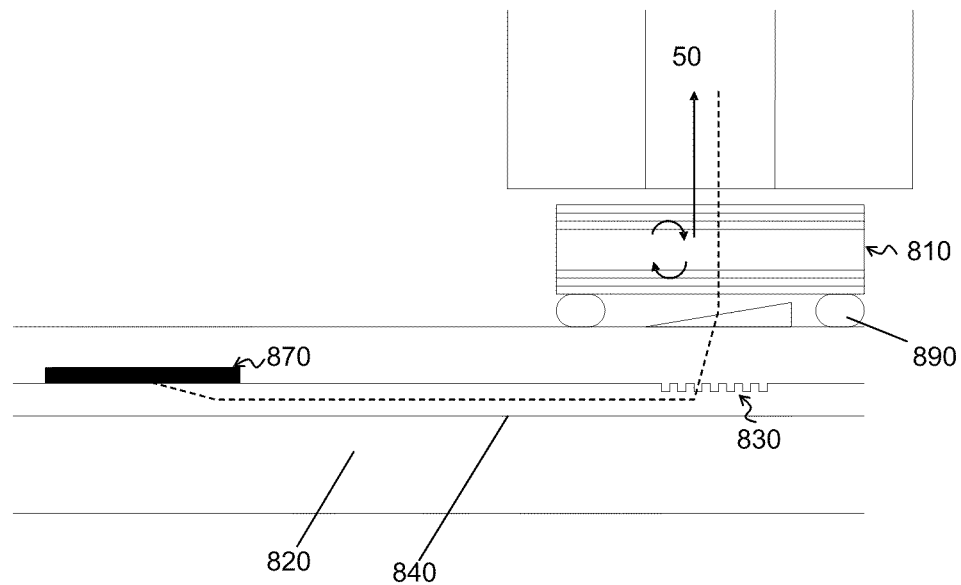
FIG. 11 shows an example of an optical system using a vertically emitting laser and integrated Ge detector, in accordance with an embodiment.

In another particular embodiment of the present invention, another transceiver is described. FIG. 11 illustrates a cross-section of a transceiver 1100 also comprising a vertically emitting III-V semiconductor laser 810 integrated above a coupling structure 830 on a silicon based photonic integrated circuit, but it furthermore comprises a photodetector 870 which, in the example shown, is an integrated germanium photodetector.

Figure 12:
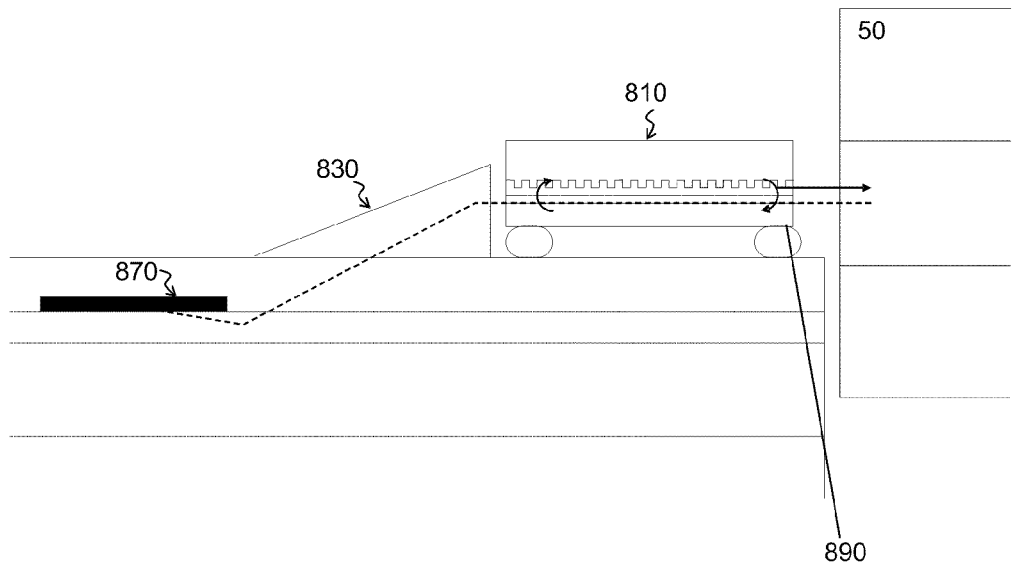
FIG. 12 shows an example of an optical system using an edge emitting laser and integrated Ge detector, in accordance with an embodiment.

FIG. 12 schematically shows a cross-section of another exemplary transceiver 1200 according to an embodiment of the present disclosure, the transceiver comprising a side emitting III-V semiconductor laser 810 (e.g. a distributed feedback (DFB) laser or Fabry-Pérot (FP) laser) and a coupling structure 830 on a silicon based photonic integrated circuit. The laser 810 can be flip-chipped using metal bumps 890 (as drawn on FIG. 12) or integrated using wafer bonding or adhesive bonding.

Figure 14:
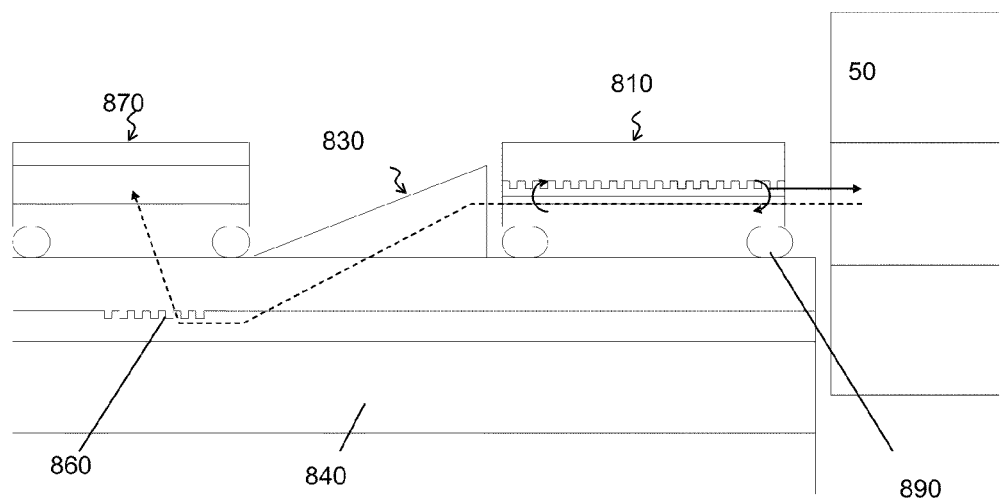
FIG. 14 shows an optical system using an edge emitting laser and a III-V detector, in accordance with an embodiment.

The laser 810 can be used for emitting optical signals, e.g. to a fiber 50, within a first wavelength band around 1310 nm. Furthermore, the laser is transparent for the 1490 nm wavelength band and/or the 1550 nm wavelength band. Therefore optical signals in the 1490/1550 nm band can be coupled from the fiber 50 (through the transparent laser) into the photonic integrated circuit and further into a photodetector 870. This is also illustrated in FIG. 14.

Figure 13:
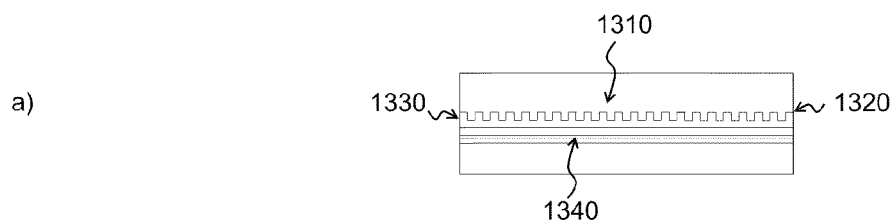
FIGS. 13a-b show cross-sections of a distributed feedback laser (FIG. 13a) and a Fabry-Pérot laser (FIG. 13b), in accordance with an embodiment.
Figure 13:
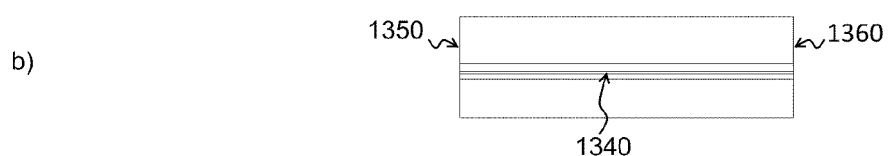

By way of illustration, FIGS. 13a-b show cross-sections of a DFB laser (FIG. 13a) and an FP laser (FIG. 13b), in accordance with an embodiment.

In the DFB laser (FIG. 13a), the reflectivity is provided by a grating, in FIG. 13a being indicated as a reflection grating 1310. A grating 1310 can be designed that reflects 1310 nm and transmits 1490 nm. In a DFB laser, typically one facet is an AR-coated facet 1320 (having a very low reflectivity) and the other facet is a HR-coated facet 1330 (having a high reflectivity). In the transparent laser, this HR coating should have a high reflectivity only for the 1310 nm wavelength band and it should have a low reflectivity for 1490 nm wavelength band. This can be achieved by a properly designed multilayer coating. The active layer 1340 also is indicated in FIG. 13a.

In the FP laser (FIG. 13b) the reflectivity is provided by cleaved facets 1350, 1360. In general these facets 1350, 1360 are not wavelength dependent. The active layer 1340 also is indicated in FIG. 13b. In the transparent laser, the facets should have a lower reflectivity for 1490 nm wavelength. This can be achieved by evaporating a properly designed coating on the facets.

In another particular embodiment, a photonic structure as described above is provided, but the transparent detector is positioned on top of the laser or, alternatively, the transparent laser is positioned on top of the detector. Such an embodiment has the advantage of avoiding the need for waveguides and coupling structures and allows for a small footprint.

In still a further particular embodiment, a photonic structure as described above is provided, but the transparent detector and the laser are positioned on top of each other but separated from each other by a substrate of the photonics device whereon or wherein an optical element for optically guiding, such as for example a lens, is provided. Such a structure can be readily easily be made through conventional manufacturing techniques such as, for example, flip chip bonding, MEMS techniques, techniques for implementing optical elements in a substrate such as lens ablation, and the like. Although this implies the use of an optically guiding part of the photonics integrated circuit, which needs to be introduced in the substrate of the photonics integrated circuit, it has particular advantages such as the fact that manufacturing is easier and/or allows more flexibility than for embodiments wherein detector and radiation source are directly positioned on top of each other.

Figure 15:
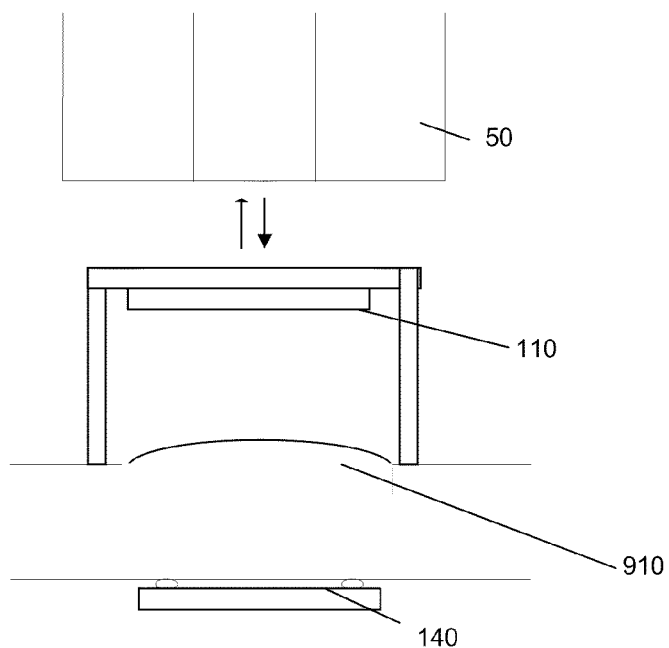
FIG. 15 shows a photonics device, in accordance with an embodiment.

By way of illustration, embodiments of the present invention not being limited thereto, an example of a photonic structure wherein a first optical device and second optical device are positioned on top of each other and wherein the photonics structure is adapted for optically guiding, using a substrate of the photonics structure and an optical element implemented thereon or therein. FIG. 15 shows a photonics device, in accordance with an embodiment. As shown in FIG. 15, the photonics device includes the first optical component 110, the second optical component 140 and the means for optically guiding 910, in the present embodiment being an optical lens element and a substrate of the photonics structure.

While the invention has been illustrated and described in detail in the drawings and foregoing description, such illustration and description are to be considered illustrative or exemplary and not restrictive. The invention is not limited to the disclosed embodiments.

For example, whereas the embodiments of the present invention refer to photonic systems, the present invention also relates to a method for processing radiation. Such a method comprises detecting radiation of a first wavelength range received from an external radiation guide or generating and directing radiation of a first wavelength range to an external radiation guide using a first optical component, and coupling radiation from within a second wavelength range, different from the first wavelength range, into or out of the photonic structure through the first optical component, the first optical component being transparent for radiation from within the second wavelength range. Other standard or optional steps correspond with steps expressing the functionality of features or components of the systems described in one or more of the above embodiments.

Other variations to the disclosed embodiments can be understood and effected by those skilled in the art in practicing the claimed invention, from a study of the drawings, the disclosure and the appended claims. A single component or other unit may fulfill the functions of several items recited in the claims. The mere fact that certain measures are recited in mutually different dependent claims does not indicate that a combination of these measures cannot be used to advantage.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

What is claimed is:

1. A photonic structure comprising:
 a detector configured to detect radiation of a first wavelength range, wherein:
  the radiation of the first wavelength range is received from an external radiation guide, and
  the detector is configured to transmit at least 50% of radiation of a second wavelength range, wherein the second wavelength range differs from the first wavelength range;
 a guiding structure comprising a waveguide that is part of the photonic structure, wherein the guiding structure is configured to optically guide the radiation of the second wavelength range in the photonic structure toward the detector; and
 a coupling structure between the guiding structure and the detector, wherein the coupling structure is configured to couple radiation of the second wavelength range from the guiding structure through the detector out of the photonic structure.

2. The photonic structure of claim 1, wherein the external radiation guide comprises an optical fiber.

3. The photonic structure of claim 1, wherein the detector is one of monolithically, heterogeneously, or hybridly integrated in the photonic structure.

4. The photonic structure of claim 1, wherein the detector comprises a photodetector.

5. The photonic structure of claim 4, wherein the photodetector comprises a III-V semiconductor photodetector.

6. The photonic structure of claim 1, wherein the coupling structure comprises one of a grating structure, a spot-size converter, or a 45° mirror.

7. The photonic structure of claim 1, further comprising:
 a second coupling structure configured to couple the radiation of the second wavelength range into the waveguide, wherein the second coupling structure is different than the coupling structure between the guiding structure and the detector.

8. The photonic structure of claim 1, further comprising a radiation source configured to generate radiation of the second wavelength range.

9. A method comprising:
 a detector detecting radiation of a first wavelength generated by an external radiation guide;
 a radiation source generating radiation of a second wavelength that differs from the first wavelength;
 a guiding structure guiding the radiation of the second wavelength through the detector, wherein the detector transmits at least 50% of the radiation of the second wavelength, wherein the guiding structure comprises a wavequide that is part of an integrated photonic circuit; and
 a coupling structure between the guiding structure and the detector coupling the radiation of the second wavelength into an external radiation guide.

* * * * *